(12) United States Patent
Yokouchi et al.

(10) Patent No.: US 6,700,914 B2
(45) Date of Patent: Mar. 2, 2004

(54) VERTICAL CAVITY SURFACE EMITTING LASER DEVICE

(75) Inventors: Noriyuki Yokouchi, Tokyo (JP); Masato Tachibana, Tokyo (JP); Natsumi Ueda, Tokyo (JP); Tatsuyuki Shinagawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 5 days.

(21) Appl. No.: 09/871,586

(22) Filed: May 30, 2001

(65) Prior Publication Data

US 2002/0101899 A1 Aug. 1, 2002

(30) Foreign Application Priority Data

Nov. 28, 2000  (JP) ........................... 2000-361317

(51) Int. Cl.[7] .............. H01S 5/00; H01S 3/08
(52) U.S. Cl. .............. 372/45; 372/46; 372/96
(58) Field of Search .............. 372/46, 45, 96

(56) References Cited

U.S. PATENT DOCUMENTS 5,493,577 A * 2/1996 Choquette et al. ............ 372/46

OTHER PUBLICATIONS

Lear et al., "Vertical Cavity Lasers on p–Doped Substrates", (1997) Electronic Letters, vol. 33 No. 9 pp. 783–784, (Apr. 1997).

* cited by examiner

Primary Examiner—Quyen Leung
(74) Attorney, Agent, or Firm—Knobbe Martens Olson & Bear LLP

(57) ABSTRACT

A vertical cavity surface emitting laser (VCSEL) device includes a pair of diffusion Bragg reflectors (DBRs) sandwiching therebetween a multiple quantum well (MQW) comprising active layers. The bottom DBR includes a lower layer structure having AlAs layers having a higher thermal conductivity and AlGaAs layers in pair and an upper layer structure acting anti-oxidation layers and having a pair of AlGaAs layers having different Al contents. A selectively oxidized AlAs layer disposed as the top layer of the bottom DBR comprises an Al-oxidized area and a non-oxidized layer for confinement of current injection path.

30 Claims, 9 Drawing Sheets

VERTICAL CAVITY SURFACE EMITTING LASER DEVICE

BACKGROUND OF THE INVENTION

1. Field of the Invention

The present invention relates to a vertical cavity surface emitting laser device (VCSEL).

2. Description of the Related Art

The vertical cavity surface emitting laser (VCSEL) device emits laser light in the direction normal to the substrate surface, and has an advantage in that a large number of such laser devices can be integrated to form a two-dimensional array on a single substrate. Thus, the VCSEL device is expected for use in a parallel optical information processing and large-capacity parallel optical transmission.

Among other VCSEL devices, a GaAs-based VCSEL device having distributed Bragg reflectors (DBRs) attracts large attention as a light source for optical communication equipment for use in the field of data communication. The GaAs-based VCSEL device includes a GaAs substrate, a pair of DBRs overlying the GaAs substrate and including a plurality of pairs of AlGaAs/AlGaAs layers having different Al contents, and at least one GaAs active layer sandwiched between the pair of AlGaAs layers as an emission area.

It is known that a VCSEL device formed on an n-type substrate has a disadvantage compared to a VCSEL device formed on a p-type substrate. The reason is as follows. A p-conductivity-type (p-type) DBR has an electric resistance inherently larger than the electric resistance of an n-type DBR. This fact necessitates a higher voltage to be applied for obtaining a necessary current between electrodes of the VCSEL device formed on the n-type GaAs substrate compared to the VCSEL device formed on the p-type GaAs substrate, in addition to the fact that the area of the p-type DBR is inherently smaller compared to the area of the n-type DBR in the VCSEL device formed on the n-type GaAs substrate due to the structure of the VCSEL device itself.

Accordingly, the GaAs-based VCSEL device developed heretofore generally has a p-type GaAs substrate, a p-type DBR formed on the substantially entire surface of the p-type GaAs substrate, an active layer and n-type DBR which are formed as an air post structure on the p-type DBR, wherein the electric resistance of the p-type DBR is reduced.

The DBR in the developed GaAs-based VCSEL device includes at least one AlGaAs layer having a highest Al content among the semiconductor layers in the VCSEL device. A specified area of the at least one AlGaAs layer in the DBR is selectively oxidized to form an Al-oxidized area having a higher electric resistance and which acts as a current confinement structure, the injected current path being limited to outside the Al-oxidized area. This structure achieves excellent lasing characteristics; for example, a higher emission efficiency is obtained with a low threshold current.

Nevertheless, there is a problem in that the thermal saturation characteristic of the optical output power in the conventional VCSEL device having a wavelength of 850 nanometers (nm) is not satisfactory. More specifically, in a high ambient temperature, the maximum optical output power of the VCSEL device is saturated and lower than the desired optical output power. This effect is shown in FIG. 3, which depicts the onset tendency of saturation appearing above about 50° C., and saturation as occurring at a temperature of about 70° C. and at an optical output power of 8.5 milli-watt (mW), whereby the optical output power cannot be increased further irrespective of the intensity of the injected current. The saturation problem is not limited to the above example of a lasing wavelength of 850 nm, and is common to other VCSEL devices irrespective of the lasing wavelength thereof.

SUMMARY OF THE INVENTION

In one aspect of the invention, a semiconductor laser comprises an active layer, a selectively oxidized layer forming a current confinement structure for channeling current through the active layer, and first and second distributed Bragg reflectors (DBR) sandwiching the active layer and the selectively oxidized layer. Each DBR comprises layers of material having different refractive indices. In addition, the first distributed Bragg reflector comprises two portions, a lower thermal conductivity portion and a higher thermal conductivity portion. Preferably, the higher thermal conductivity portion comprises layers of a first material having a thermal conductivity of at least about 50 W/Km.

In another aspect of the invention, a vertical cavity surface emitting laser (VCSEL) device comprises a substrate, a bottom distributed Bragg reflector (DBR) disposed over the substrate, a selectively oxidized layer formed over the bottom DBR, at least one active layer formed over the selectively oxidized layer, and a top distributed Bragg reflector (DBR) formed over the active layer. The bottom DBR is divided into upper and lower sections, each comprising a plurality of layers of semiconductor material. The lower section is proximate to the substrate and includes one or more aluminum containing and substantially gallium free layers. All of the plurality of layers forming the upper section include both aluminum and gallium. The selectively oxidized layer over the bottom DBR forms a current confinement structure.

In still another aspect of the invention a vertical cavity surface emitting laser (VCSEL) device includes a substrate, bottom and top distributed Bragg reflectors (DBRs) overlying the substrate, each of the bottom and top DBRs including a plurality of first semiconductor layers and a plurality of second semiconductor layers each disposed for a corresponding one of the first semiconductor layers to form a pair and having a refractive index lower than a refractive index of the first semiconductor layers, at least one active layer sandwiched between the bottom DBR and the top DBR, the bottom DBR including AlAs layers as the second semiconductor layers, one of the AlAs layers being formed as a selectively oxidized layer having therein an Al-oxidized area for defining a current confinement structure, and at least one anti-oxidation layer disposed between the one of the AlAs layers and another of the AlAs layers, the anti-oxidation layer having an oxidation rate lower than an oxidation rate of the AlAs layers.

In accordance with this VCSEL device, the anti-oxidation layer between the selectively oxidized AlAs layer formed as the top layer of the bottom DBR and the AlAs layer of the bottom DBR effectively prevents the AlAs layers in the bottom DBR from being oxidized. The thermal resistance of the bottom DBR can thereby be reduced and thus an excellent thermal saturation characteristic of the VCSEL device can be obtained. Consequently, this device is capable of operating at a higher output power with a higher stability in a high ambient temperature environment.

The above and other objects, features and advantages of the present invention will be more apparent from the following description, referring to the accompanying drawings.

DETAILED DESCRIPTION OF THE PREFERRED EMBODIMENT

Figure 1:
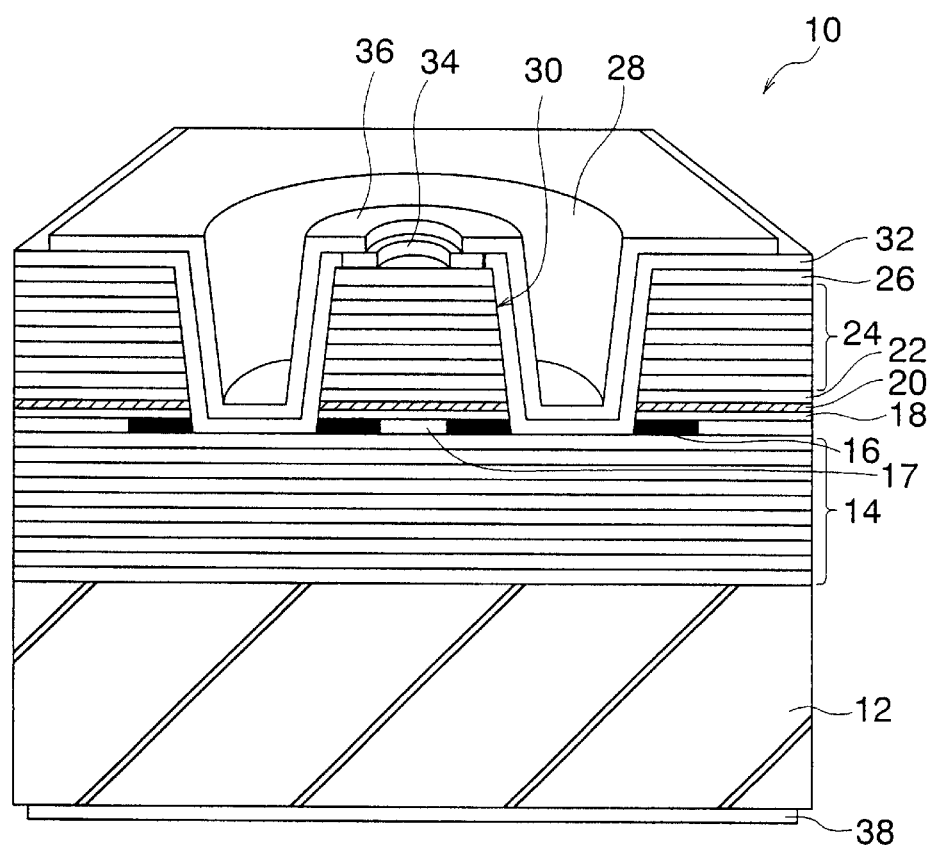
FIG. 1 is a perspective view of a conventional VCSEL device having DBRs.
Figure 2:
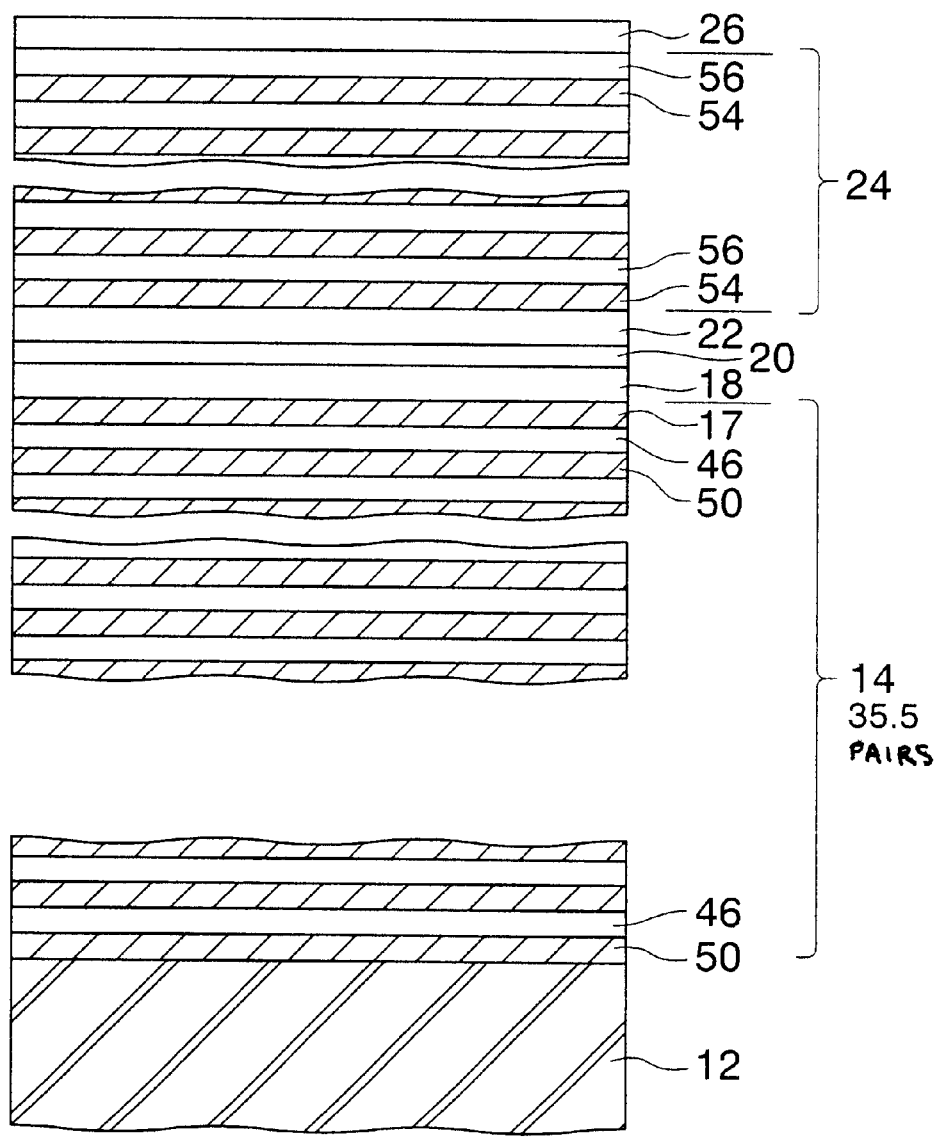
FIG. 2 is a schematic sectional view of the conventional VCSEL device of FIG. 1.

A VCSEL device of the type as described above and having a lasing wavelength of about 850 mn is described herein with reference to FIGS. 1 and 2 which show a perspective view and a schematic sectional view, respectively, thereof. The VCSEL device generally designated by numeral 10 includes a 100-$\mu$m-thick p-type GaAs substrate 12, and a bottom DBR 14 having a p-type layer structure, an AlAs layer 17 including Al-oxidized areas 16 as a current confinement structure, an undoped AlGaAs bottom cladding layer 18, a GaAs quantum well structure 20, an undoped AlGaAs top cladding layer 22, a top DBR 24 having an n-type layer structure and an n-type GaAs cap layer 26 which are consecutively formed on the p-type GaAs substrate 12.

An annular vertical cavity (groove) 28 is formed in the n-type GaAs cap layer 26, top DBR 24, undoped AlGaAs top cladding layer 22, GaAs quantum well structure 20, undoped AlGaAs bottom cladding layer 18, and AlAs layer 17 including the Al-oxidized areas 16 to configure an air post structure 30 having a diameter of about 40–45 $\mu$m and encircled by the annular groove 28.

The Al-oxidized areas 16 are formed by selectively oxidizing a portion of the AlAs layer 17 along the side-wall of the air post structure 30, with the central area of the AlAs layer 17 being left as a non-oxidized area to constitute a current injection path.

The bottom DBR 14 includes a multi-pair structure including 35.5 pairs of p-type $Al_{0.9}Ga_{0.1}As$ layer 50 and p-type $Al_{0.2}Ga_{0.8}As$ layer 46, each pair sandwiching therebetween a 20-nm-thick intermediate layer (not shown) having a gradient or graded content for Al, wherein the Al content of the intermediate layer is substantially equal to the Al content of the $Al_{0.9}Ga_{0.1}As$ layer in the vicinity thereof, is substantially equal to the Al content of $Al_{0.2}Ga_{0.8}As$ layer in the vicinity thereof, and has a gradient within the layer.

The top DBR 24 includes a multi-pair layer structure including 30 pairs of n-type $Al_{0.9}Ga_{0.1}As$ layer 54/n-type $Al_{0.2}Ga_{0.8}As$ layer 56, each pair sandwiching therebetween a 20-nm-thick intermediate layer having a gradient Al content.

The $Al_{0.2}Ga_{0.8}As$ layers 46 (56) and $Al_{0.9}Ga_{0.1}As$ layers 50 (54) have thicknesses of about 40 nm and 50 nm, respectively.

The topmost layer of the bottom DBR 14 is formed by the 50-nm-thick p-type AlAs layer (or selectively oxidized layer) 17 including the Al-oxidized area 16 along the side-wall of the annular groove 28 instead of the p-type $Al_{0.9}Ga_{0.1}As$ layer 50. More specifically, the Al-oxidized area 16 is such that Al in the outer area of the AlAs layer 17 is selectively oxidized along the annular groove 28, and functions as a current confinement structure having a higher electric resistance. The remaining portion of the p-type AlAs layer 17 which is left as the non-oxidized area in the air post 30 is configured as a circular area having a diameter of about 15 to 20 $\mu$m and defines a current injection path.

A silicon nitride layer 32 is deposited on the entire surface including the top of the air post structure 30 and the side-wall of the annular groove 28. A circular portion of the silicon nitride film 32 on the top of the air post structure 30 is selectively removed in a 30-$\mu$m-diameter region which exposes the n-type cap layer 26. On top of the exposed n-type cap layer 26, an annular n-side electrode layer 34 made of AuGeNi/Au films is formed, which has an inner diameter of about 20 $\mu$m and an outer diameter of about 30 $\mu$m. An n-side electrode pad 36 made of Ti/Pt/Au films having a central opening is formed on the n-side electrode 34. On the bottom surface of the p-type GaAs substrate 12, a AuZn p-side electrode 38 is formed.

Suppression of temperature rise in an active layer of a VCSEL is most important for improving the thermal saturation characteristic of the VCSEL device. This conclusion is based on experiments which demonstrate the following facts.

First, temperature rise of the active layer increases with the increase of the thermal resistance $R_{th}$ of the VCSEL device. The thermal resistance $R_{th}$ (K/W) of the VCSEL device is expressed in terms of the thermal conductivity $\sigma_{th}$ and the specific resistivity $\rho_{th}$ of each material and dimensions (length L and area S) as follows:

$$R_{th}=1/(\sigma_{th} \times S)=\rho_{th} \times L/S.$$

The temperature rise $\Delta T$ of the active layer is expressed in terms of power consumption "Q" in the active layer by the following formula:

$$\Delta T = R_{th} \times Q.$$

This means that a higher thermal resistance $R_{th}$ results in a higher temperature rise $\Delta T$ in the active layer.

Figure 4:
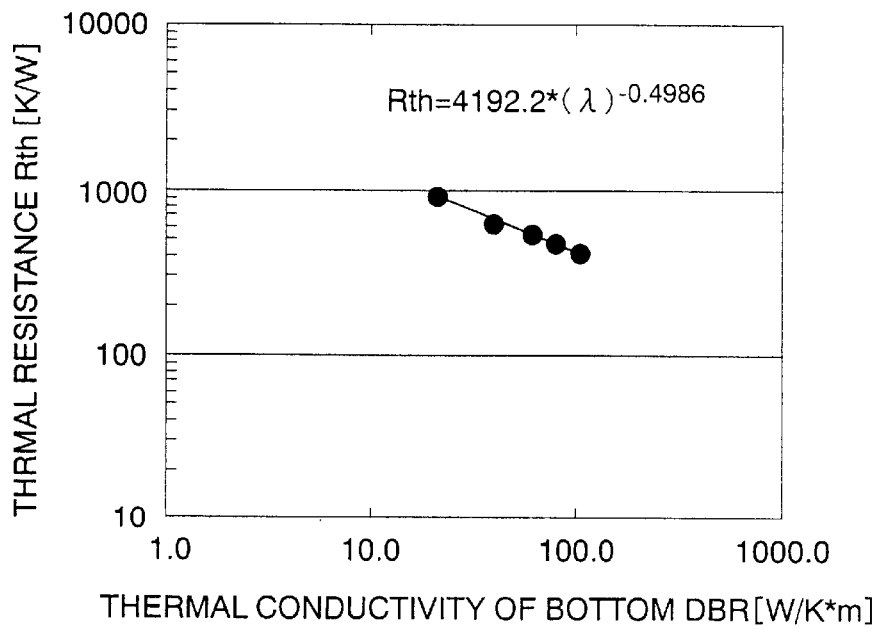
FIG. 4 is a graph showing the relationship between the thermal resistance $R_{th}$ and the thermal conductivity of the bottom DBR in a general VCSEL device.
Figure 5:
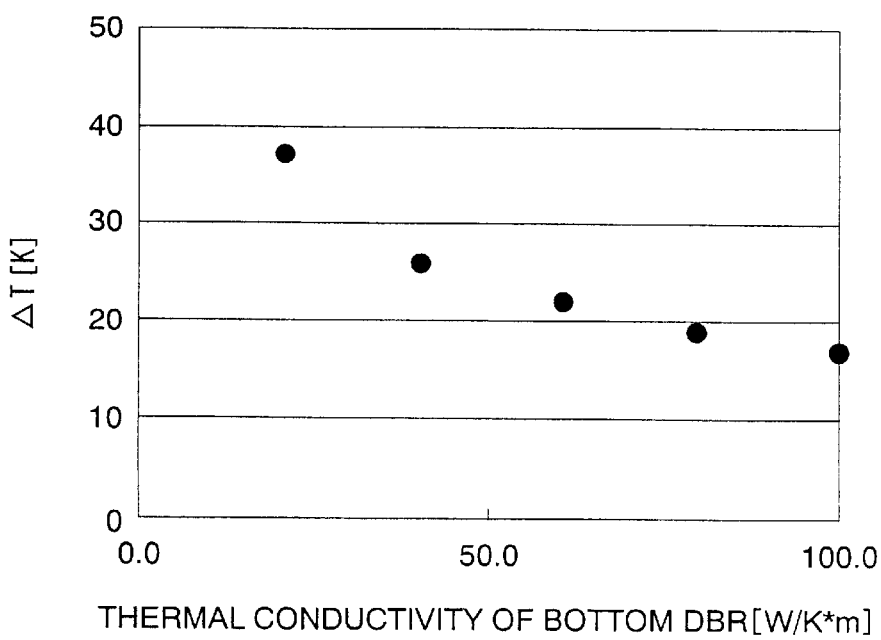
FIG. 5 is a graph showing the relationship between the temperature rise $\Delta T$ of the active layer and the thermal conductivity of the bottom DBR in a general VCSEL device.
Figure 6:
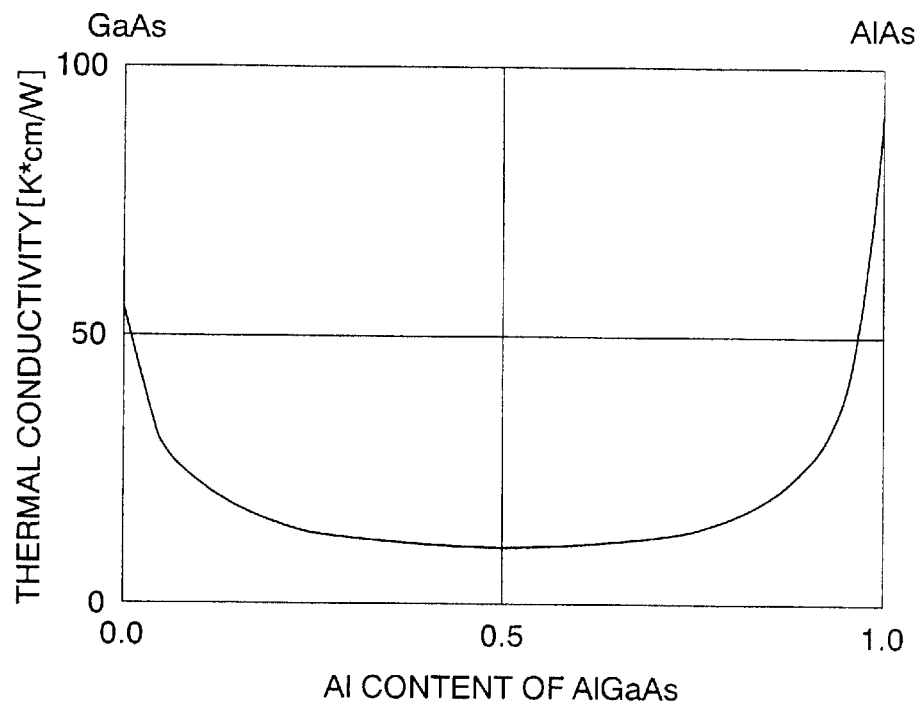
FIG. 6 is a graph showing the relationship between the thermal conductivity and the mixed ratio of $Al_xGa_{1-x}As$.

An investigation of the factors for reducing the thermal resistance $R_{th}$ (K/W) of the VCSEL device with the intention of suppression of the temperature rise of the active layer reveal the following facts:

a larger thermal conductivity of the bottom DBR reduces the thermal resistance $R_{th}$ of the VCSEL device, as shown in FIGS. 4 and 5, thereby significantly suppressing the temperature rise $\Delta T$ of the active layer;

a larger thermal conductivity of the top DBR does not effectively suppress the temperature rise ΔT of the active layer; and the thermal conductivity of the $Al_xGa_{1-x}As$ mixed crystal, as shown in FIG. 6, is non-linear with respect to the Al content (X), wherein the thermal conductivity is relatively large in the vicinity of zero for X, is at a minimum at 0.5 for X, and a maximum at 1.0 for X.

Figure 7:
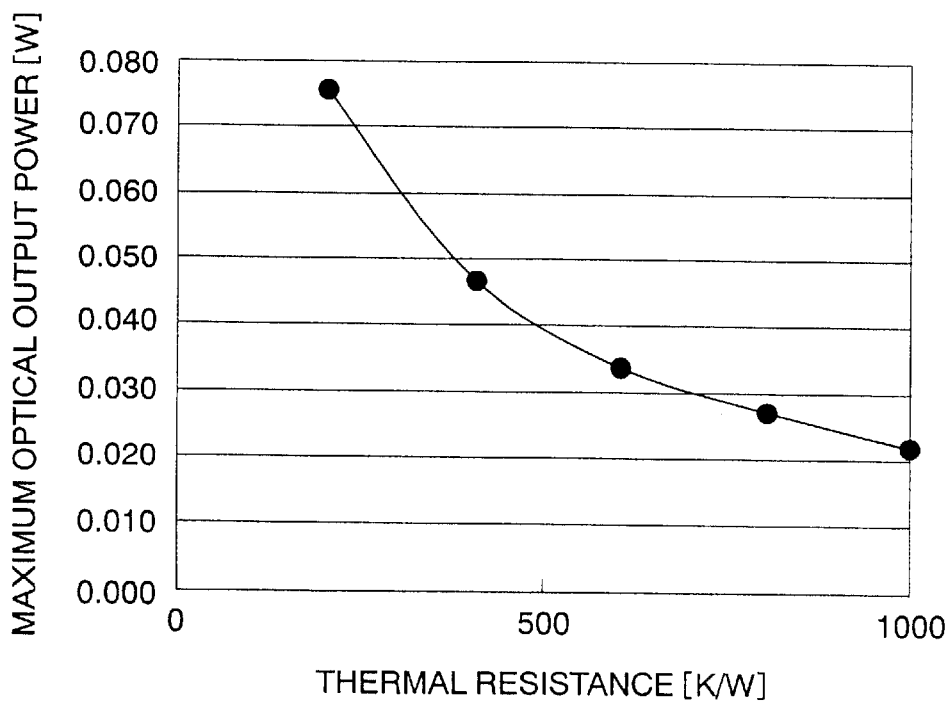
FIG. 7 is a graph showing the relationship between the maximum optical output power and the thermal resistance in a general VCSEL device.

Accordingly, the maximum optical output power of the VCSEL device increases with the reduction of the thermal resistance of the VCSEL device, as shown in FIG. 7. Similarly, a larger thermal conductivity of the bottom DBR therefore can improve the thermal saturation characteristic of the VCSEL device.

For instance, the pair of AlGaAs/AlGaAs layers constituting the bottom DBR in a conventional VCSEL device are generally implemented by a combination of $Al_{0.9}Ga_{0.1}As$ layer and $Al_{0.2}Ga_{0.8}As$ layer, and the Al-containing semiconductor layer in which the Al-oxidized area is to be formed is implemented by an AlAs layer or an $Al_{0.9}Ga_{1-x}As$ layer having an Al content (X) of about 0.95 or more.

In the conventional VCSEL device, however, the thermal conductivities of the $Al_{0.9}Ga_{0.1}As$ layer and $Al_{0.2}Ga_{0.8}As$ layer are about 25.8 W/Km and 15 W/Km, respectively. In contrast, the thermal conductivity of AlAs is about 91 W/Km, which is much higher, thereby improving the thermal conductivity of the bottom DBR.

Thus, the improvement of the thermal saturation characteristic of the VCSEL device can be obtained by a bottom DBR including a lower-refractive-index AlAs layer having a higher thermal conductivity and a higher-refractive-index $Al_{0.2}Ga_{0.8}As$ layer, as a pair of reflectance layers. It will be appreciated that layers having an aluminum content (X) of less than 1 may be used as well if they have a sufficiently high thermal conductivity. Preferably, the aluminum content (X) of these layers is about 0.97 or more, such that the thermal conductivity of these layers is greater than about 50 W/Km, as shown in FIG. 6.

The improvement was confirmed by experiments described more fully below. It is to be noted that the thermal conductivity of the GaAs substrate is about 54.0 W/Km and thus significantly higher than those of the $Al_{0.9}Ga_{0.1}As$ and $Al_{0.2}Ga_{0.8}As$.

Second, the temperature rise of the active layer is suppressed down to about 20° C. provided that the relationship between the number ($m_1$) of pairs of AlGaAs/AlGaAs in the upper portion of the bottom DBR (near the oxidized layer) and the number ($m_2$) of pairs of AlGaAs/AlAs in the lower portion of the bottom DBR (near the substrate) is such that $m_1/(m_1+m_2)$ is equal to or less than about 20/35 or 4/7.

In experiments, the preferable relationship between the number "$m_1$" and the number "$m_2$" has been investigated by fabrication of samples of a variety of VCSEL devices having different numbers for "$m_1$" between zero and 35 for the VCSEL devices each having a number of 35 for ($m_1+m_2$). That is, the relationship between the number "$m_2$" (or "$m_1$") and the temperature rise of the active layer was investigated, and the following results were obtained.

TABLE 1

| $m_1$ | Thermal resistance (K/W) | Temperature rise (° C.) |
| --- | --- | --- |
| 35 | 920 | 28 |
| 25 | 770 | 23 |
| 20 | 716 | 21 |
| 15 | 673 | 20 |

TABLE 1-continued

| $m_1$ | Thermal resistance (K/W) | Temperature rise (° C.) |
| --- | --- | --- |
| 10 | 636 | 19 |
| 5 | 605 | 18 |
| 0 | 578 | 17 |

The results of the experiments showed that 20 or less than 20 for "$m_1$" substantially suppressed the temperature rise of the active layer down to about 20° C. or below. Preferably, $m_1$ is also 1 or more to produce an oxidation resistant portion of the bottom DBR to allow the formation of the oxidized current confinement layer without affecting the previously deposited DBR layers.

Now, the present invention is more specifically described with reference to accompanying drawings, wherein similar constituent elements are designated by similar reference numerals.

Figure 8:
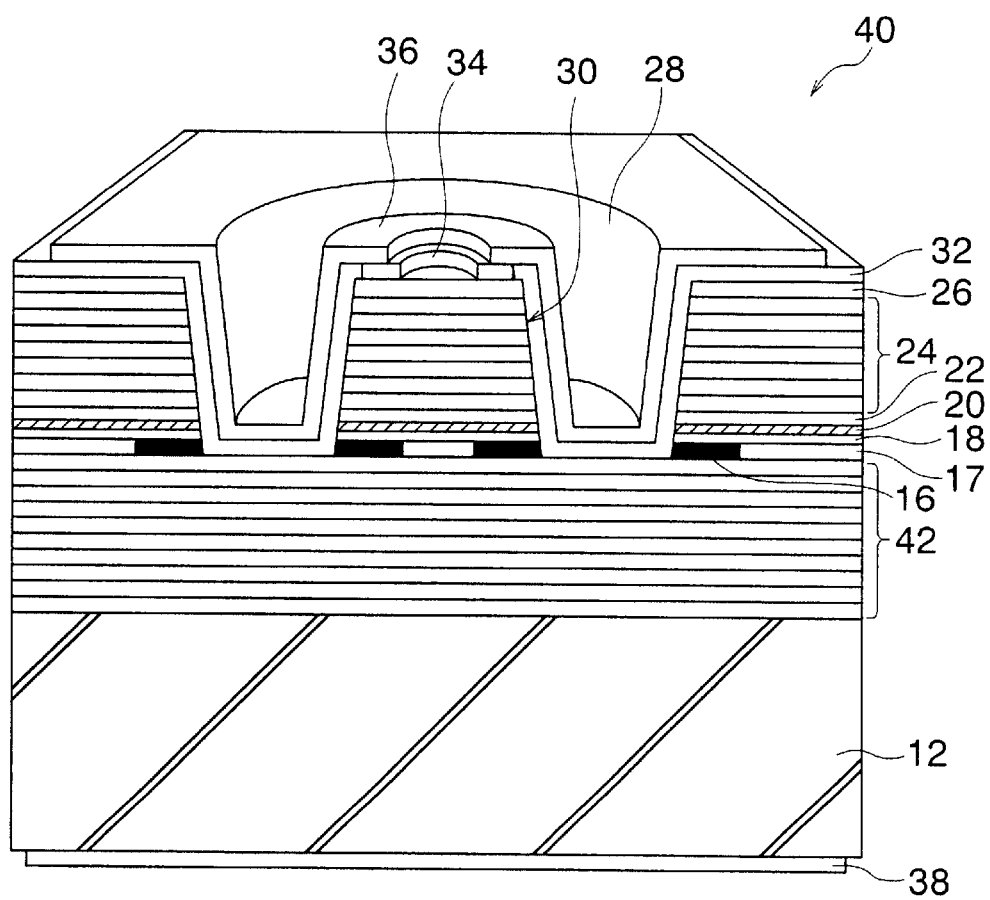
FIG. 8 is a perspective view of a VCSEL device according to an embodiment of the present invention.

Referring to FIG. 8, a VCSEL device, generally designated by numeral 40, according to one embodiment of the present invention includes a 100-μm-thick p-type GaAs substrate 12, and a bottom DBR 42, undoped AlGaAs bottom cladding layer 18, and AlAs layer 17 including the Al-oxidized areas 16, a GaAs quantum well structure 20, an undoped AlGaAs top cladding layer 22, an n-type top DBR 24 and an n-type GaAs cap layer 26 which are consecutively formed on the p-type GaAs substrate 12. The bottom DBR 42 14 includes a lower layer structure, an upper layer structure, and an AlAs layer 17, as detailed below.

An annular groove 28 is formed in the n-GaAs cap layer 26, top DBR 24, undoped AlGaAs top cladding layer 22, GaAs quantum well structure 20, undoped AlGaAs bottom cladding layer 18, and AlAs layer 17 including the Al-oxidized areas 16 to configure an air post structure 30 having a diameter of about 40–45 μm and encircled by the annular groove 28.

The Al-oxidized areas 16 are formed by selectively oxidizing the AlAs layer 17 along the sidewall of the air post structure 30, with the central area of the AlAs layer 17 being left as a non-oxidized area, which constitutes a current injection path.

The VCSEL device 40 of the present embodiment emits laser having a wavelength of about 850 nm, and is largely similar to the VCSEL 10 of FIG. 1 with some significant difference such as the structure of the bottom DBR 42.

Figure 9:
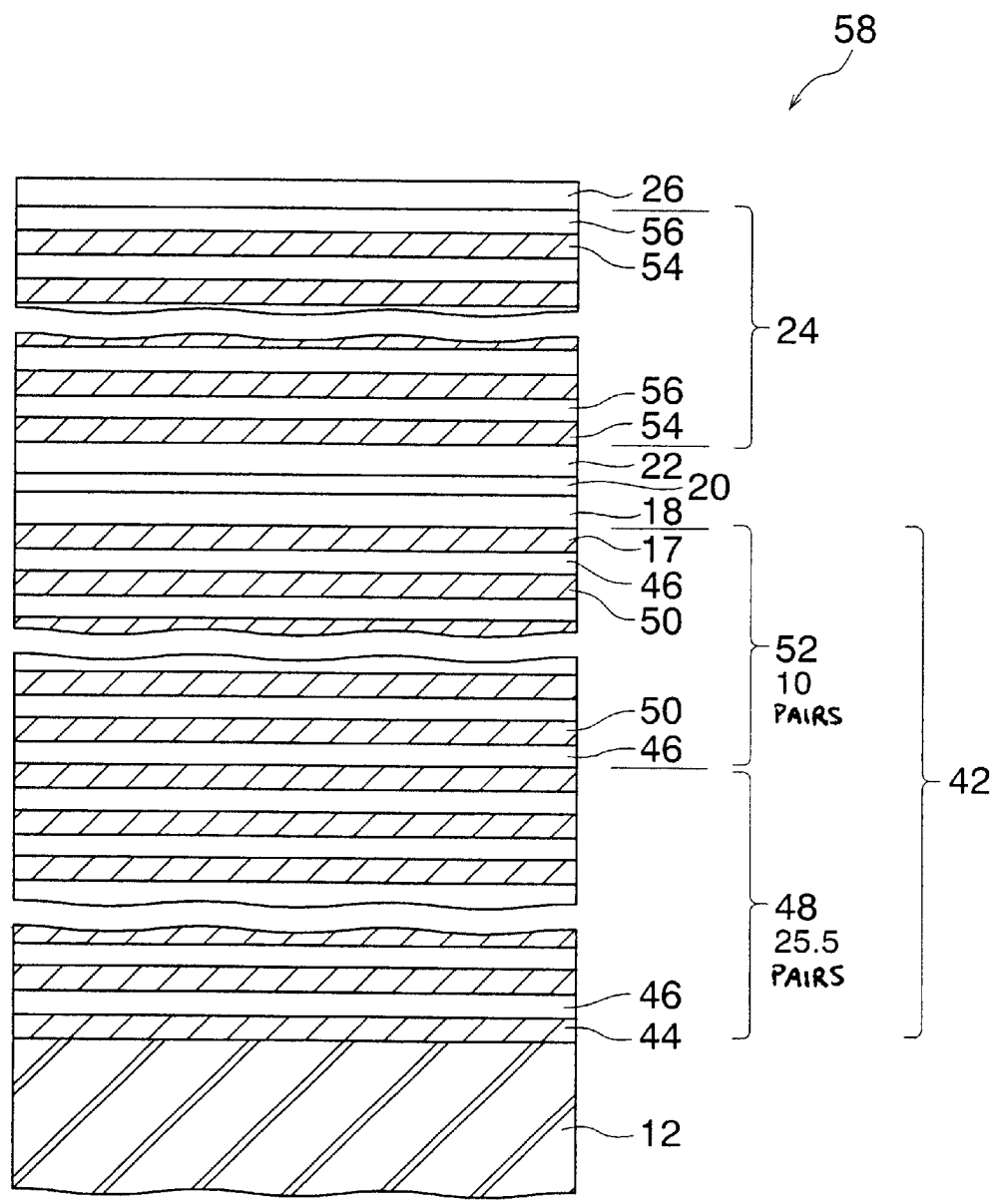
FIG. 9 is a sectional view of the VCSEL device of FIG. 8.

Referring to FIG. 9, the bottom DBR 42 includes a lower layer structure 48 including 25.5 pairs of layers, each of the 25 pairs including a p-type AlAs layer 44 formed as a lower-refractive-index layer and a p-type $Al_{0.2}Ga_{0.8}As$ layer 46 formed as a higher-refractive-index layer, and an upper layer structure 52 formed on the lower layer structure and including 10 pairs of layers, each of the 10 pairs including a p-type $Al_{0.2}Ga_{0.8}As$ layer 46 and a p-type $Al_{0.9}Ga_{1.0}As$ layer 50. The AlAs layer 17 constitutes the remaining 0.5 pair of the bottom DBR 42. More specifically, the structure of the bottom DBR 42 is such that the lower layer structure 48 includes 26 pairs of layers including the AlAs layer 17 and 44 as the lower-refractive-index layers of the bottom DBR 42 and that the upper layer structure 52 is interposed between the top AlAs layer 17 of the lower layer structure 48 and a corresponding AlGaAs layer 46 of the lower layer structure 48 for prevention of oxidation of the AlAs layers 44 during oxidation of the AlAs layer 17.

Each of the p-type AlAs layers 44 and 17 has a thickness of about 50 nm, and the p-type $Al_{0.2}Ga_{0.8}As$ layer 46 and the p-type AlGaAs layer 50 have thicknesses of about 40 nm and 50 nm, respectively.

The Al content of the AlAs layer 17 is selectively oxidized to form Al-oxidized areas 16, which encircle the air post structure 30 along the side-wall of the annular groove 28. The Al-oxidized area 16 functions as a current blocking layer, with the central area of the AlAs layer 17 being left as a non-oxidized layer which constitutes a current injection path.

The VCSEL device of FIG. 8 is fabricated as follows. First, the lower layer structure 48 of the bottom DBR 42 and the upper layer structure 52 of the bottom DBR 42 are consecutively deposited on the p-type GaAs substrate 12 by using a metal-organic chemical vapor deposition (MOCVD) technique. In the deposition of the upper layer structure 52, the topmost layer of the upper layer structure 52 is formed by the 50-nm-thick AlAs layer 17 instead of the p-type $Al_{0.9}Ga_{0.1}As$ layer 50.

Subsequently, a 93-nm-thick undoped $Al_{0.3}Ga_{0.7}As$ bottom cladding layer 18, a $GaAs/Al_{0.2}Ga_{0.8}As$ multiple quantum well (MQW) structure 20 and a 93-nm-thick undoped $Al_{0.3}Ga_{0.7}As$ top cladding layer 22 are consecutively grown on the upper layer structure 52. The MQW structure 20 includes three 7-nm-thick GaAs quantum well active layers and 10-nm-thick $Al_{0.2}Ga_{0.8}As$ barrier layers sandwiched between adjacent GaAs active layers.

Thereafter, the top DBR 24 is grown on the top cladding layer 22, the top DBR 24 including 30 pairs of layers, each pair including an n-type $Al_{0.9}Ga_{0.1}As$ layer 54 and an n-type $Al_{0.2}Ga_{0.8}As$ layer 56.

Subsequently, the 10-nm-thick n-GaAs cap layer 26 is grown on the n-type AlGaAs layer 56 which is the topmost layer of the top DBR 24, thereby achieving the structure shown in FIG. 9.

Subsequently, a silicon nitride film (not shown) is deposited on the n-type GaAs cap layer 26 by using a plasma-enhanced CVD technique, followed by forming a photoresist film thereon. Thereafter, a circular pattern having a diameter of about 40 to 45 μm is transferred onto the photoresist film to form a circular etching mask (not shown) by using a photolithographic technique.

The silicon nitride film is then selectively etched by a reactive ion etching (RIE) technique using the circular photoresist pattern as an etching mask and $CF_4$ as an etching gas. Thereafter, a reactive ion beam etching (RIBE) is conducted using chlorine gas to etch the top DBR 24, the top cladding layer 22, the $GaAs/Al_{0.2}Ga_{0.8}As$ MQW structure 20, the bottom cladding layer 18 and the p-type AlAs layer 17, whereby the annular groove 28 is formed therein. Thus, an air post structure 30 having a cylindrical shape is obtained.

The RIBE step is stopped between the p-type AlAs layer 17 and the lower layer structure 48 of the bottom DBR 42, i.e., within the upper layer structure 52 including AlAs/AlGaAs layers 46 and 50. More specifically, 10 pairs of p-type $Al_{0.2}Ga_{0.8}As$ layer/p-type $Al_{0.9}Ga_{0.1}As$ layer of the upper layer structure 52 functions as control layers which control the depth of the etching by the RIBE step.

Subsequently, the semiconductor layer assembly 58 having the air post structure 30 is subjected to a heat treatment in a steam ambient at a temperature of about 400° C. for about 25 minutes. The heat treatment allows the p-type AlAs layer 17 disposed as the topmost layer of the bottom DBR 42 to be selectively oxidized, whereby the Al-oxidized areas 16 are formed along the annular groove 28, with the central area of the AlAs layer 17 being left as a non-oxidized area. The non-oxidized central area of the p-type AlAs layer 17 is of a circle having a diameter of about 15 to 20 μm and functions as a current injection path.

In the selective oxidation, the p-type $Al_{0.2}Ga_{0.8}As$/p-type $Al_{0.9}Ga_{0.1}As$ layers 46 and 50 in the upper layer structure 52 of the bottom DBR 42 function as anti-oxidation layers, which prevent the p-type AlAs layers 44 in the lower layer structure 48 from being oxidized to form an Al-oxidized area.

Thereafter, the silicon nitride layer (not shown) is completely removed using a RIE technique, followed by deposition of another silicon nitride film 32 on the entire surface by a plasma-enhanced CVD technique (see FIG. 8).

A circular portion of the another silicon nitride film 32 disposed on top of the air post structure 30 and having a diameter of about 30 μm is then removed, followed by deposition of an annular AuGeNi/Au n-side electrode 34 having an inner diameter of about 20 μm and an outer diameter of about 30 μm. In addition, an electrode pad 36 made of Ti/Pt/Au film is formed on the n-side electrode 34.

The bottom surface of the p-type GaAs substrate 12 is polished to obtain a thickness of about 100 μm for the GaAs substrate 12, followed by evaporation of AuZn to form a p-side electrode 38 on the polished bottom surface.

Finally, an annealing treatment is conducted in a nitrogen ambient at about 400° C., whereby the VCSEL device 40 as shown in FIG. 8 is completed which has a lasing wavelength of about 850 nm.

FIRST EXAMPLE

Figure 10:
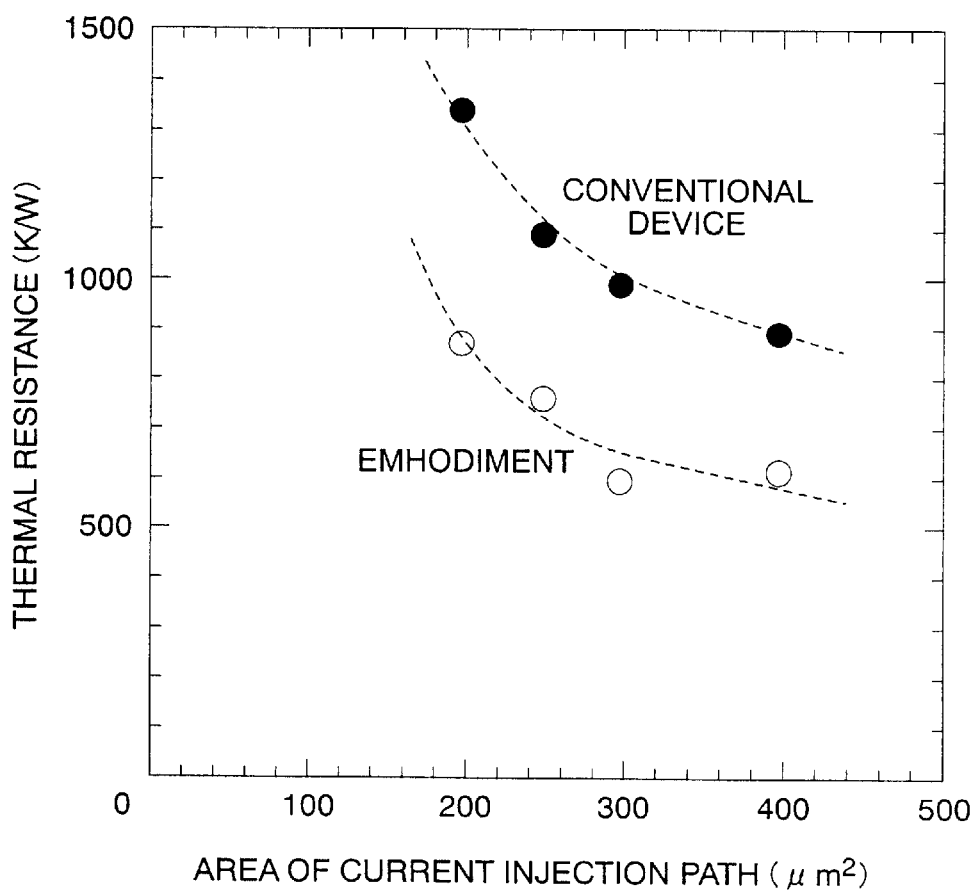
FIG. 10 is a graph showing the relationship between the thermal conductivity and the area of the current injection path for one embodiment of the VCSEL of the present invention and a conventional VCSEL for comparison of the embodiment of the VCSEL device of the present invention with the conventional device.

Samples of the VCSEL device that possess a plurality of high thermally conductive layers as shown in FIG. 8 were fabricated on a single wafer. These samples included the air post structures 30 having different diameters, and thus had different areas for the current injection paths. The relationship between the area of the current injection path and the thermal resistance of the VCSEL device was investigated in these samples and other samples of the conventional device, whereby results shown in FIG. 10 were obtained. The other samples of the conventional device had a structure largely similar to that shown in FIG. 8 with some significant differences, such as the structure of the bottom DBR; wherein the conventional device had no lower layer structure.

The thermal resistance becomes generally lower with the increase of the area for the current injection path. As understood from FIG. 10, the thermal resistance of the VCSEL device of the present embodiment characterized by curve 60 is about 300 K/W lower compared to the conventional device characterized by curve 62 in the range between 150 $\mu m^2$ and 400 $\mu m^2$ for the area of the current injection path.

SECOND EXAMPLE

Another sample of the VCSEL device of the present embodiment possessing high thermally conductivity and having an effective emission area of about 300 $\mu m^2$ was fabricated. A comparative example based on the conventional design was also fabricated. This conventional design had a structure similar to the structure of the high thermal conductive sample with some significant differences, such as in the lower layer structure, e.g., the comparative example did not have an AlAs layer as a lower-refractive index layer.

The relationship between the optical output power and the injected current is investigated in both the high thermally conductive sample and the comparative example, with the operational temperature thereof being varied. The results shown in FIG. 11 were obtained to demonstrate the temperature dependency of the output power-injected current characteristic.

Figure 3:
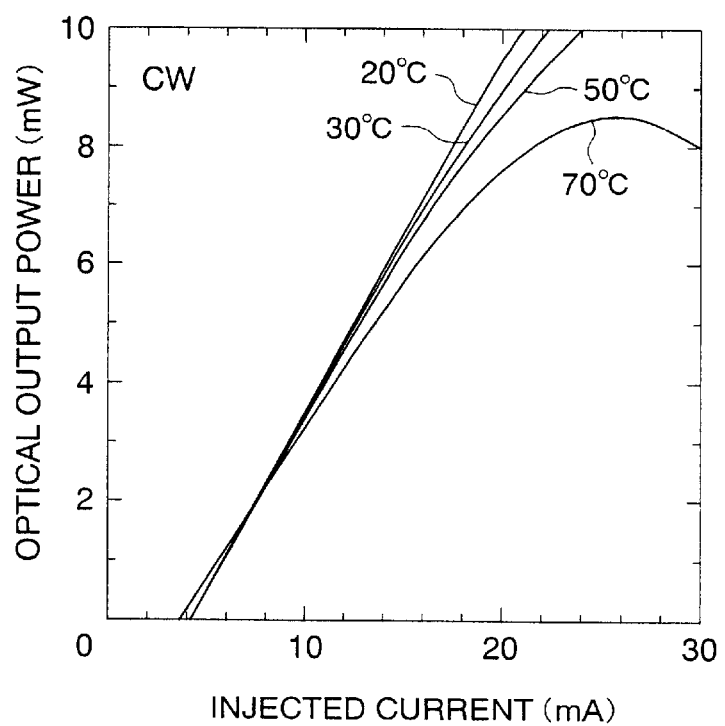
FIG. 3 is a graph showing the thermal saturation characteristic of the conventional VCSEL device of FIG. 1.
Figure 11:
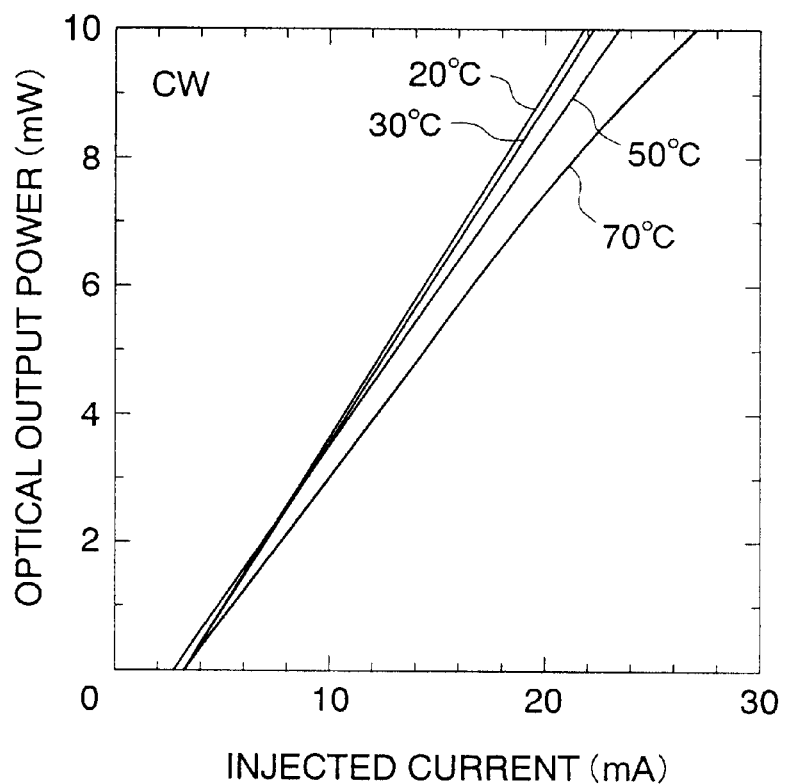
FIG. 11 is a graph showing the relationship between the optical output power and the injected current for one embodiment of the present invention.

As understood from the comparison of FIG. 11 and FIG. 3, although a difference is not observed between both the devices at room temperature (i.e. between about 20° C. and 30° C.), the VCSEL device of the present embodiment achieved a higher optical output power at a temperature of about 70° C. More specifically, as high as 90% of the optical output power at room temperature was achieved. In addition, the optical output power could be increased with the increase of the injected current at the same temperature. In the conventional device, however, as shown in FIG. 3, the optical output power exhibited a saturation at 70° C. at about 8.5 mW and the optical output power could not be increased further even with the increase of the injected current.

The first and second examples revealed an excellent feature of the VCSEL device of the present embodiment, i.e. that the thermal saturation characteristic of the optical output power is improved over the conventional device. Thus, it was confirmed that the VCSEL device of the present invention could operate stably at a higher output power at a higher ambient temperature than conventional devices.

In the embodiment described above, the upper layer structure 52 including 10 pairs of $Al_{0.9}Ga_{0.1}As/Al_{0.2}Ga_{0.8}As$ layers is interposed between the selectively oxidized AlAs layer 17 and the lower layer structure 48 of the bottom DBR 42 including 25.5 pairs of $AlAs/Al_{0.2}Ga_{0.8}As$ layers. The upper layer structure 52 functions as anti-oxidation layers for the AlAs layers 44 in the lower layer structure 48, as well as etch control layers for controlling the etching depth of the annular groove 28 which defines the air post structure 30. If the etching for the annular groove 28 is stopped precisely at the underlying layer in contact with the AlAs layer 17, the number of the pairs of layers in the upper layer structure 52 may be reduced to further reduce the thermal resistance of the bottom DBR 42.

In the above embodiment, the VCSEL device having a lasing wavelength of 850 nm is exemplified. However, the present invention is applicable to any VCSEL device including a semiconductor material having an Al content irrespective of the lasing wavelength. For example, the present invention can be applied to a VCSEL device fabricated on a GaAs substrate and lasing at a wavelength of 900 nm or higher, or another VCSEL device having a GaInNAs MQW active layer structure.

Since the above embodiments are described only for examples, the present invention is not limited to the above embodiments and various modifications or alterations can be easily made therefrom by those skilled in the art without departing from the scope of the present invention. For example, it may in some cases be desirable to produce a surface down bonded VCSEL structure, wherein the "top" DBR includes high thermal conductivity AlAs layers. In another embodiment, the performance of an edge emitting laser with DBR mirrors may be improved by the incorporation of high thermal conductivity AlAs layers. In most cases, however, a DBR including a high thermal conductivity portion of AlAs layers will be adjacent to a mounting substrate to maximize total heat transfer away from the active layer.

What is claimed is:

1. A semiconductor laser comprising:
   an active layer;
   a selectively oxidized layer forming a current confinement structure for channeling current through said active layer;
   first and second distributed Bragg reflectors (DBR) sandwiching said active layer and said selectively oxidized layer, wherein each DBR comprises layers of material having different refractive indices, and wherein said first distributed Bragg reflector comprises two portions, an oxidation resistant portion and a high thermal conductivity portion having higher thermal conductivity than that of said oxidation resistant portion,
   wherein both said oxidation resistant portion and said high thermal conductivity portions comprise separate multi-layer stacks and wherein the oxidation resistant stack is located between said current confinement structure and said high thermal conductivity stack.

2. The laser of claim 1, wherein said two portions of said first DBR have different aluminum content.

3. The laser of claim 2, wherein all of said layers of material in said oxidation resistant portion comprise gallium.

4. The laser of claim 3, wherein at least some layers of material in said high thermal conductivity portion are essentially gallium free.

5. The laser of claim 4, wherein at least some layers of material in said high thermal conductivity section consist essentially of AlAs.

6. The laser of claim 1, wherein said first distributed Bragg reflector is formed on a substrate comprising GaAs.

7. The laser of claim 6, wherein said first DBR and said substrate are p-type.

8. The laser of claim 1, wherein said high conductivity portion comprises layers of a first material having a thermal conductivity at least about 50.0 W/Km.

9. The laser of claim 8, wherein said high conductivity portion comprises layers of material consisting essentially of AlAs.

10. The laser of claim 9, wherein said high conductivity portion comprises layers of material consisting essentially of $Al_{0.2}Ga_{0.8}As$.

11. A vertical cavity surface emitting laser (VCSEL) device comprising:
    a substrate;
    a bottom distributed Bragg reflector (DBR) disposed over said substerate, said bottom DBR being divided into upper and lower sections, each comprising a plurality of layers of semiconductor material, wherein said lower section is proximate to said substrate, wherein said lower section includes one or more aluminum containing and substantially gallium free layers; and wherein all of said plurality of layers forming said upper section include both aluminum and gallium;
    a selectively oxidized layer forming a current confinement structure formed over said bottom DBR;
    at least one active layer formed over said selectively oxidized layer; and
    a top distributed Bragg reflector (DBR) formed over said active layer.

12. A vertical cavity surface emitting laser (VCSEL) device comprising:
    a substrate;
    a bottom distributed Bragg reflector (DBR) disposed over said substrate, said bottom DBR being divided into two sections, an upper section and a lower section,
    said upper section comprising a plurality ($m_1$) of pairs of alternating layers of a first aluminum gallium arsenide alloy and a second aluminum gallium arsenide alloy, said first aluminum gallium arsenide alloy having different aluminum content than said second aluminum gallium arsenide alloy,
    said lower section comprising a plurality of ($m_2$) of pairs of alternating layers of AlAs and a third aluminum gallium arsenide alloy;

at least one active layer above said bottom DBR; and a top distributed Bragg reflector (DBR) over said active layer, said top DBR comprising alternating layers of aluminum gallium arsenide alloy, wherein $m_1$ is a number greater than one corresponding to the number of pairs of layers in said upper section, each said pair comprising a layer of a first aluminum gallium arsenide alloy and a layer of a second aluminum gallium arsenide alloy, and $m_2$ is a number greater than one corresponding to the number of pairs of layers in said lower section, each said pair comprising a layer of AlAs and a layer of a third aluminum gallium arsenide alloy.

13. The vertical cavity surface emitting laser device of claim 12, wherein said first aluminum gallium arsenide alloy comprises $Al_{0.9}Ga_{0.1}As$, and wherein said second and third aluminum gallium arsenide alloy comprises $Al_{0.2}Ga_{0.8}As$.

14. The vertical cavity surface emitting laser device of claim 13, wherein $m_1/(m_1+m_2) \leq 4/7$.

15. The vertical cavity surface emitting laser device of claim 12, wherein $1 < m_1 \leq 20$.

16. A vertical cavity surface emitting laser (VCSEL) comprising semiconductor, said VCSEL laser comprising:
 a substrate;
 an active layer;
 a selectively oxidized layer forming a current confinement structure for channeling current through said active layer, said active layer formed over said selectively oxidized layer; and
 top and bottom distributed Bragg reflectors (DBR) disposed over said substrate sandwiching said active layer and said selectively oxidized layer, said top DBR disposed over said active layer, said active layer and said current confinement structure disposed above said bottom DBR, each DBR comprising layers of material having different refractive indices,
 wherein said bottom DBR comprises a plurality of semiconductor materials, said bottom DBR comprising:
  an upper oxidation resistant portion comprising a plurality ($m_1$) of pairs of alternating layers of a first aluminum gallium arsenide alloy and a second aluminum gallium arsenide alloy, said first aluminum gallium arsenide alloy having different aluminum content than said second aluminum gallium arsenside alloy, and
  a lower high thermal conductivity portion proximate to said substrate that comprises a plurality ($m_2$) of pairs of alternating layers of AlAs and a third aluminum gallium arsenide alloy, said high thermal conductivity portion having higher thermal conductivity than that of said oxidation resistant portion, and
 wherein said top DBR comprises alternating layers of aluminum gallium arsenide alloy and the oxidation resistant portion is located between said current confinement structure and said high thermal conductivity portion.

17. The VCSEL of claim 16, wherein said two portions of said first DBR have different aluminum content.

18. The laser of claim 17, wherein all of said layers of material in said oxidation resistant portion comprise gallium.

19. The laser of claim 16, wherein said first distributed Bragg reflector is formed on a substrate comprising GaAs.

20. The laser of claim 19, wherein said first DBR and said substrate are p-type.

21. The laser of claim 16, wherein said high conductivity portion comprises layers of a first material having a thermal conductivity at least about 50.0 W/Km.

22. The laser of claim 16, wherein said high thermal conductivity portion comprises layers of material consisting essentially of $Al_{0.2}Ga_{0.8}As$.

23. The vertical cavity surface emitting laser device of claim 16, wherein said first aluminum gallium arsenide alloy comprises $Al_{0.9}Ga_{0.8}As$, and wherein said second and third aluminum gallium arsenide alloy comprises $Al_{0.2}Ga_{0.8}As$.

24. The vertical cavity surface emitting laser device of claim 23, wherein $m_1/(m_1+m_2) \leq 4/7$.

25. The vertical cavity surface emitting laser device of claim wherein $1 < m_1 \leq 20$.

26. A vertical cavity surface emitting laser (VCSEL) device comprising:
 a substrate;
 a bottom distributed Bragg reflector (DBR) disposed over said substrate, said bottom DBR being divided into upper and lower sections, each comprising alternating layers of semiconductor material, wherein said lower section is proximate to said substrate, wherein said lower section includes one or more aluminum containing and substantially gallium free layers; and wherein said alternating layers forming said upper section include both aluminum and gallium;
 at least one selectively oxidized layer forming a current confinement structure formed over said bottom DBR;
 at least one active layer formed over said bottom DBR; and
 a top distributed Bragg reflector (DBR) formed over said active layer.

27. The laser of claim 26, wherein at least some layers of material in said lower section consist essentially of AlAs.

28. The laser of claim 26, wherein said bottom distributed Bragg reflector is formed on a substrate comprising GaAs.

29. The laser of claim 28, wherein said bottom DBR and said substrate are p-type.

30. The laser of claim 26, wherein said lower section comprises layers of material consisting essentially of $Al_{0.2}Ga_{0.8}As$.

* * * * *